US005767717A

United States Patent [19]

Schorn et al.

[11] Patent Number: 5,767,717
[45] Date of Patent: *Jun. 16, 1998

[54] HIGH PERFORMANCE DYNAMIC LOGIC COMPATIBLE AND SCANNABLE TRANSPARENT LATCH

[75] Inventors: Eric Bernard Schorn; Raymond George Stephany, both of Austin, Tex.

[73] Assignee: International Business Machines Corporation, Armonk, N.Y.

[*] Notice: The term of this patent shall not extend beyond the expiration date of Pat. No. 5,461,331.

[21] Appl. No.: 606,932

[22] Filed: Feb. 21, 1996

Related U.S. Application Data

[63] Continuation of Ser. No. 282,116, Jul. 28, 1994, abandoned.

[51] Int. Cl.⁶ .................................. H03K 19/096
[52] U.S. Cl. .................... 327/210; 327/212; 327/218
[58] Field of Search ....................... 327/199, 1, 203, 327/205, 206, 208, 210–212, 214–215, 225; 326/95–97

[56] References Cited

U.S. PATENT DOCUMENTS

| 4,114,049 | 9/1978 | Suzuki | 327/214 |
|---|---|---|---|
| 4,521,695 | 6/1985 | Matin et al | 327/211 |
| 4,554,664 | 11/1985 | Schultz . | |
| 4,580,137 | 4/1986 | Fiedler et al. . | |
| 4,588,944 | 5/1986 | Rothenberger . | |
| 4,629,909 | 12/1986 | Cameron | 327/211 |
| 4,692,633 | 9/1987 | Ngai et al. . | |
| 4,698,588 | 10/1987 | Hwang et al. . | |
| 4,800,300 | 1/1989 | Walters, Jr. | 327/210 |
| 4,845,675 | 7/1989 | Krenik et al. . | |
| 4,975,595 | 12/1990 | Roberts et al. . | |
| 5,003,204 | 3/1991 | Cushing et al. . | |
| 5,041,742 | 8/1991 | Carbonaro . | |
| 5,111,078 | 5/1992 | Miyamoto et al. | 327/201 |
| 5,148,052 | 9/1992 | Tellamilli | 327/218 |
| 5,166,604 | 11/1992 | Ahanin et al. . | |
| 5,179,295 | 1/1993 | Mattison et al. | 327/199 |
| 5,225,724 | 7/1993 | Scarra'et al. . | |
| 5,276,371 | 1/1994 | Jinbo | 327/379 |
| 5,276,858 | 1/1994 | Oak et al. . | |
| 5,281,870 | 1/1994 | Kobatake | 327/379 |
| 5,283,478 | 2/1994 | Maloberti et al. | 327/379 |
| 5,285,153 | 2/1994 | Ahanin et al. . | |
| 5,289,518 | 2/1994 | Nakao | 327/218 |
| 5,311,070 | 5/1994 | Dooley | 327/208 |
| 5,343,099 | 8/1994 | Shichinohe | 327/384 |
| 5,349,247 | 9/1994 | Hush et al. | 327/379 |
| 5,369,316 | 11/1994 | Chen et al. | 327/379 |
| 5,461,331 | 10/1995 | Schorn | 327/206 |

FOREIGN PATENT DOCUMENTS

| 350219 | 1/1990 | European Pat. Off. | 327/211 |
|---|---|---|---|
| 404083414 | 3/1992 | Japan | 327/211 |
| 404167612 | 6/1992 | Japan | 327/199 |
| 6-120782 | 4/1994 | Japan | 327/202 |

OTHER PUBLICATIONS

Solid State Circuits –"High Speed CMOS Circuits Technique" By Jipen Yuan and Christer Svensson. –Feb., 1989.

Primary Examiner—Timothy P. Callahan
Assistant Examiner—T. T. Lam
Attorney, Agent, or Firm—Anthony V.S. England; Brian F. Russell; Andrew J. Dillon

[57] ABSTRACT

A high performance dynamic logic compatible transparent latch is provided. The latch comprises a first switchable invertor circuit, a second invertor circuit, and a third switchable invertor circuit. The first invertor, having a data input, a clock input and an output, is enabled by a first phase of an input clock and is disabled by a second phase of the input clock. The second invertor has an input connected to the first invertor output. The third invertor has a clock input, and is enabled by the second phase of the input clock and disabled by the first phase of the input clock, and further has an input connected to the second invertor output and an output connected to the second invertor input.

12 Claims, 4 Drawing Sheets

HIGH PERFORMANCE DYNAMIC LOGIC COMPATIBLE AND SCANNABLE TRANSPARENT LATCH

This is a continuation of application Ser. No. 08/282,116, filed 28 Jul. 1994 now abandoned.

BACKGROUND OF THE INVENTION

1. Technical Field

The present invention relates in general to digital circuits, and more particularly to high-speed data latching circuits for temporarily storing digital information.

2. Description of the Related Art

Digital processing circuits often require latches for temporarily storing digital signals when transferring such signals between circuits. Such applications include high-speed A/D and D/A converters, high-speed memories such as RAMs, ROMs, and EPROMs, high-speed pipelined logic circuits, and other applications.

A typical prior art scannable D-type transparent latch is shown in FIG. 1. When this latch is loading data it is transparent. While loading, "Clock" is high and "Clock_bar" is low. The clock signals "Clock" and "Clock_bar" simultaneously turn on transmission gate 10 and turn off transmission gate 20. This breaks the feedback path 12 to allow writing into the latch through the data path 16 by the data multiplexor 14 selected input (data or scan data). When the latch switches to its holding cycle, feedback multiplexor 22 is switched to open the feedback path 12. Clock and Clock_bar change state and close transmission gate 10 to terminate the latch transparency. Simultaneously, transmission gate 20 is opened to open the feedback path 12 and allow the input data value to be latched.

This latch would be clocked to assure that the data being transferred is reliably stored, and that a coordinated transfer is accomplished without loss of data. In order to ensure that a data latch reliably stores digital signals presented at its input, there is a set up time prior to and a hold time immediately after the clock signal. The set up and hold times indicate a loading period in which the input data must be held stable. At the end of this hold period, the control signal disables the latch and the last value applied to the latch is "frozen" and held until the enabling signal is applied again.

As seen in FIG. 1, a clock signal and its complement must be generated to operate the latch. These signals are inherently non-coincident. Therefore, set up and hold timing requirements are extended by this generation delay. An additional problem arises during high-speed operation. The shortest data path through the latch requires signal to pass through two multiplexors and an invertor. Thus, significant data path delay is introduced. High-speed data operations are optimized by minimizing the data hold time of the latches and the data path length.

In order to improve latch performance, some latches are designed for use with dynamic logic. In such circuits, data is represented by the presence or non-presence of a leading edge of a pulse. The data pulse usually has a window in time (evaluate phase) during which it can make only one transition from its standby state (inactive) to an active state. The data is considered valid at the end of this window. While the latch is in its holding cycle (i.e. latching), the input value to the latch is preset. This creates the standby state of the latch. For example, the standby state could be a high value and a falling edge would indicate an active state. If the data does not make a transition from the standby state, the output value of the latch is the preset inactive value. If the data does make a transition, the output is set to the active value in response to the transition. By using such dynamic logic, set up and hold times are eliminated, substantially enhancing the speed of the latch.

Therefore, another disadvantage with the latch in FIG. 1 is that it is not dynamic-logic compatible. When the latch is transparent, the data path is not completely edge sensitive due to the presence of transmission gates. This significantly slews the pulse edge which represents data in dynamic logic. Such a delay reduces the performance of the latch and prevents its use with dynamic logic.

It would be desirable to provide a high-performance latch which is dynamic logic compatible. It would further be desirable to have such a latch which has very short input-to-output delay, has a single data clock, has dual rail outputs with high charge coupling resistance, and is tunable to a variety of parameters including edge sensitivity, edge delay, and charge coupling resistance.

SUMMARY OF THE INVENTION

According to the present invention, a high performance dynamic logic compatible transparent latch is provided. The latch comprises a first switchable invertor circuit, a second invertor circuit, and a third switchable invertor circuit. The first invertor, having a data input, a clock input and an output, is enabled by a first phase of an input clock and is disabled by a second phase of the input clock. The second invertor has an input connected to the first invertor output. The third invertor has a clock input, and is enabled by the second phase of the input clock and disabled by the first phase of the input clock, and further has an input connected to the second invertor output and an output connected to the second invertor input.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 2:
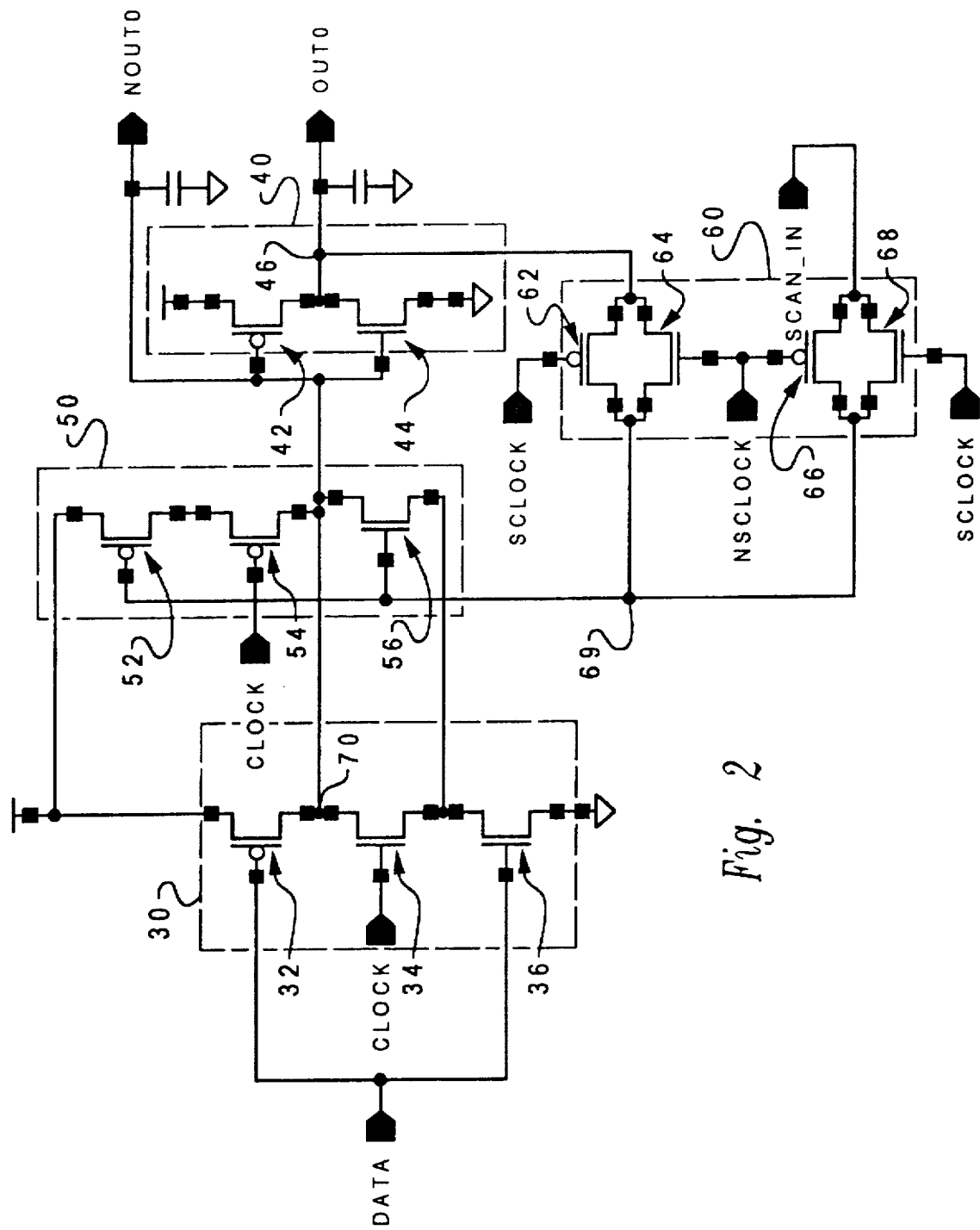
FIG. 2 depicts a high performance dynamic logic compatible latch in accordance with a preferred embodiment of the present invention.

Referring now to FIG. 2, there is depicted a preferred embodiment of a high performance dynamic logic compatible and scannable transparent latch of the present invention. The latch includes a switchable input invertor 30, an output invertor 40, and a switchable feedback invertor 50. Additionally, there is a transmission circuit 60 which provides for selectively connecting data or scan data to the latch.

In particular, the preferred embodiment of the present invention is falling edge dynamic logic compatible as shown in FIG. 2 and is arranged as follows. Input invertor 30 is comprised of transistors 32, 34 and 36. PMOS transistor 32 has a source connected to an upper reference voltage, a drain connected to the drain of NMOS transistor 34, and a gate controlled by the data signal input DATA. NMOS transistor 34 has a source connected to the drain of NMOS transistor 36, and a gate controlled by the clock signal CLOCK. The source of NMOS transistor 36 is connected to a lower reference voltage, in this case ground, and its gate is controlled by the DATA signal input. The common node between transistor 32 and transistor 34 is the output node 70.

Output invertor 40 is comprised of transistors 42 and 44. PMOS transistor 42 has a source connected to an upper reference voltage, a gate connected to output node 70, and a drain connected to the drain of NMOS transistor 44. NMOS transistor 44 has a gate connected to output node 70 and a source connected to the lower reference voltage. This configuration provides the well known and well understood CMOS Inverter with an output at node 46.

Transmission circuit 60 is comprised of transistors 62, 64, 66 and 68. PMOS transistor 62 is connected in parallel with NMOS transistor 64 between nodes 46 and 69. A scan clock signal SCLOCK controls PMOS transistor 62 and the complementary scan clock signal NSCLOCK controls NMOS transistor 64. PMOS transistor 66 is connected in parallel with NMOS transistor 68 between a scan data input SCAN_IN and node 69. The gate of PMOS transistor 66 is controlled by NSCLOCK and the gate to NMOS transistor 68 is controlled by SCLOCK.

Feedback invertor 50 is comprised of PMOS transistors 52 and 54 and NMOS transistor 56. PMOS transistor 52 has a source connected to an upper reference voltage, a gate connected to node 69, and a drain connected to the source of PMOS transistor 54. PMOS transistor 54 has the clock signal CLOCK connected to its gate and output node 70 to its drain. NMOS transistor 56 has a drain connected to output node 70, a gate connected to node 69, and a source connected to the drain of NMOS transistor 36.

The operation of the preferred embodiment of the present invention as disclosed in FIG. 2 proceeds as follows. The clock signal, CLOCK, is a square wave having a high level and a low level, preferably equal to the upper reference voltage and the lower reference voltage, respectively. During the period that the clock signal is in one state, in this case a low level, the latch is operating in a latch phase. When operating in a second state, in this case the high level, the latch operates in an evaluate phase.

During the latch phase, the clock level is low, and transistor 34 is shut off. This disengages the connection between output node 70 and transistor 36. Transistor 54 is turned on by the low clock signal and transistor 36 is turned on by a precharged high voltage on the data input lines that is always present during the latching phase (as explained below). This allows either PMOS transistor 52 or NMOS transistor 56 to conduct, electric charge depending on their gate inputs.

During the latch phase, the data value present on the output node 70 is latched on the two complementary outputs by output invertor 40 and feedback invertor 50. If a high value has been set on output node 70, transistors 42 and 44 operate together as a CMOS invertor and create a low output on node 46. Because the latch is being operated in its data input mode, transmission circuit 60 allows the latch's output to be fed back into feedback invertor 50. This would be accomplished by setting the scan clock SCLOCK high and NSCLOCK low. These inputs would turn on transistor 62 and 64 and turn off transistor 66 and 68. The low voltage output on node 46 is transferred through transmission gates 62, 64 and input at the gates of transistors 52 and 56. Transistor 52 would be turned on and transistor 56 would turn off. This would pull output node 70 to the upper reference voltage, effectively locking the output rails of the latch. On the other hand, if the output node 70 had been set to a low level just prior to the clock signal going low, the CMOS invertor 40 would output a high level to turn off the pull-up transistor 52 and turn on the pull-down transistor 56. With both NMOS transistors 56 and 36 conducting, output node 70 is latched to a low value.

Note that during the latch phase the data value present on the output node 70 is latched on the outputs by output invertor 40 and feedback invertor 50, and that output node 70 is directly connected to PMOS transistor 32. Normally, such a design would be unacceptable. During latching, the data signal input must be disabled from the latching circuitry. Thus, a prior art latch would be required to include an additional transistor in input invertor 30 to isolate transistor 32 from output node 70 during the latching phase.

The present invention has taken advantage of dynamic logic to simplify the latch design. During the latching phase, the data signal input lines, DATA, are precharged to a predetermined voltage level that indicates an inactive data level. The latch in FIG. 2 is designed for high-speed reaction to a falling edge. Therefore, the data signal inputs to the latch are precharged to an upper level voltage. As can be seen from FIG. 2, the input to PMOS transistor 32 will always be a high signal during the precharge phase, and thus, it will always be shut off when the output rails are being latched. Thus, the present invention has taken advantage of dynamic logic to eliminate an isolating transistor from the inverter design.

When the clock signal goes high, the latch enters the evaluate phase. Transistor 34 is turned on, forcing output node 70 to a low level through transistor 36, which was turned on during the precharge period. Simultaneously, the high clock signal turns off PMOS transistor 54. If the data signal does not make a transition to an active low value while the clock is high, the data value has the entire evaluate phase to pass through the latch. In other words, the non-presence of a pulse at the input of the latch indicates a first logic state which is instantly available on the output rails at the end of the evaluate phase.

If the data signal does make a transition to its active low value during the evaluate phase, the second logic state is quickly latched to the output. The high-speed latching of dynamic logic in the high-performance latch of the present invention is accomplished by tuning the input and output inverters to be edge sensitive. In the case of the circuit in FIG. 2, input invertor 30 and output invertor 40 are tuned to react quickly to a falling edge. The ratio of transistor sizes between selected transistors is made extremely large. For example, the W/L of transistor 32 may be four to eight times larger than transistors 34 and 36. In a similar manner, transistor 42 may be four to eight times larger than transistor 44. Such ratios would generate extremely fast transitions from low to high at output node 70 and from high to low at node 46. Thus, a falling leading edge of a pulse would force transistors 32 and 44 to turn on at high speed. However, at the rising trailing edge of the data input pulse, transistors 34, 36 and 42 turn on much slower. Because the latch is being clocked at a very high speed by the clock input signal, the latch will have entered the latching phase before the rising edge drives the smaller transistors into conduction and are able to alter the held value.

Moreover, if the ratio of sizes between transistors 32 and the combination of transistors 34, 36 is set high, the latch input switching level will be a relatively high voltage and will not be affected by the start of precharge. In addition, the large feedback transistors in feedback invertor 50 will work to further offset any potential effect. Further, because the latch of the present invention uses a single phase clock, rather than a clock and its complement, the potential for precharge race-through caused by skewed clocks is reduced.

In summary, if the non-presence of a data pulse is detected at the inputs to the latch during the evaluate phase, the preset logic state is instantly available on the output rails at the end of the evaluate phase. If the presence of a data pulse is detected at the data input during the evaluate phase, the latch is tuned to quickly respond to the falling edge transition and alter the logic state output on the output rails of the latch. Therefore, the latch is able to latch a digital value at a very high speed based on the presence or non-presence of a clock edge at the input. This latch provides significant speed advantages over the prior art by eliminating set up and hold times required for static logic latches. This high-performance dynamic logic compatible latch with scan and data inputs is accomplished using a minimum of transistors, thus providing a compact, inexpensive and simple design.

Figure 3:
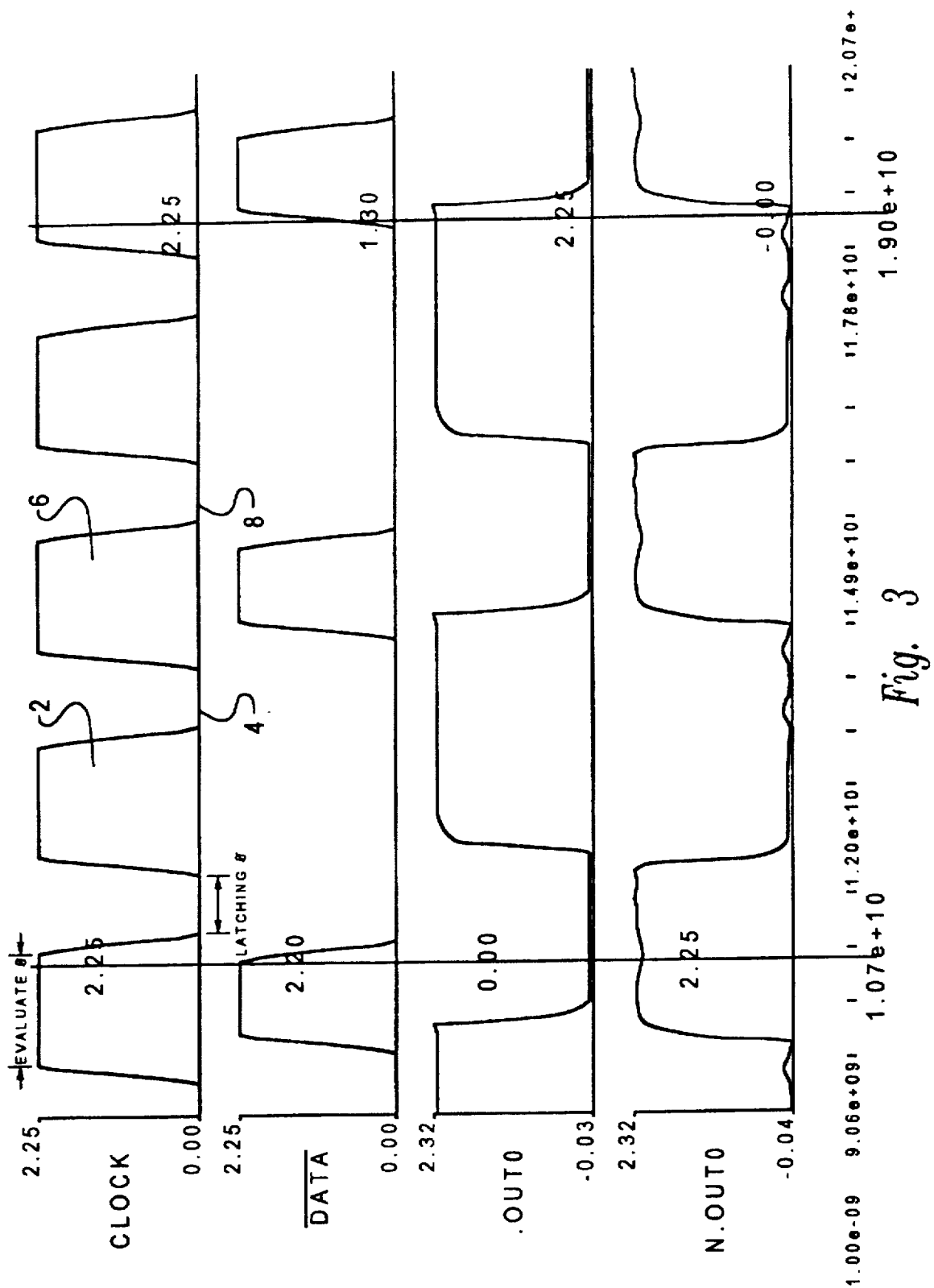
FIG. 3 depicts a timing diagram for the preferred embodiment of FIG. 2.

Referring now to FIG. 3, there is depicted a timing diagram for the latch circuit of FIG. 2. The clock signal CLOCK is periodically clocked between its two reference voltages 0 volts and 2.25 volts. The evaluate phase is that period of time when the clock is at the upper level (2.25 volts). The latching phase is that period during which the clock is at its lower reference level (0 volts). Note that Data_bar shows the inverse of the data signal input. Therefore, falling edges of the data signal are shown as rising edges in the graph of Data_bar.

As shown in FIG. 3, during the first evaluate phase of the clock, a data pulse occurs. The two output rails of the latch respond to the falling edge of the data signal input by altering logic states. There is very little delay in the response of the outputs because they respond to the falling edge of the data input signal and do not have to wait for the data input signal to settle to a static level. Although the rising edge of the pulse occurs during the evaluate phase, the latch has been tuned to respond very quickly to falling edges and very slowly to rising edges. Therefore, the output logic state that was set by the data input pulse during the first evaluate phase does not change before the latch enters the latching phase. During the first latching phase, the output of the latch, OUT0, is held low.

During the second evaluate phase 2, the latch becomes transparent. Seeing the data signal at the high reference level set by the precharge, the output rail OUT0 goes high. During the second evaluate phase 2, the latch detects the non-presence of a pulse in the evaluate phase and stays in the inactive logic state. This is indicated by a high level on OUT0 during the second latching phase 4. When the clock toggles into the third evaluate phase 6, the output rails of the latch again alter logic states in response to the second data pulse on data_bar and latch the low logic state on OUT0 during the third latching phase 8.

Figure 4:
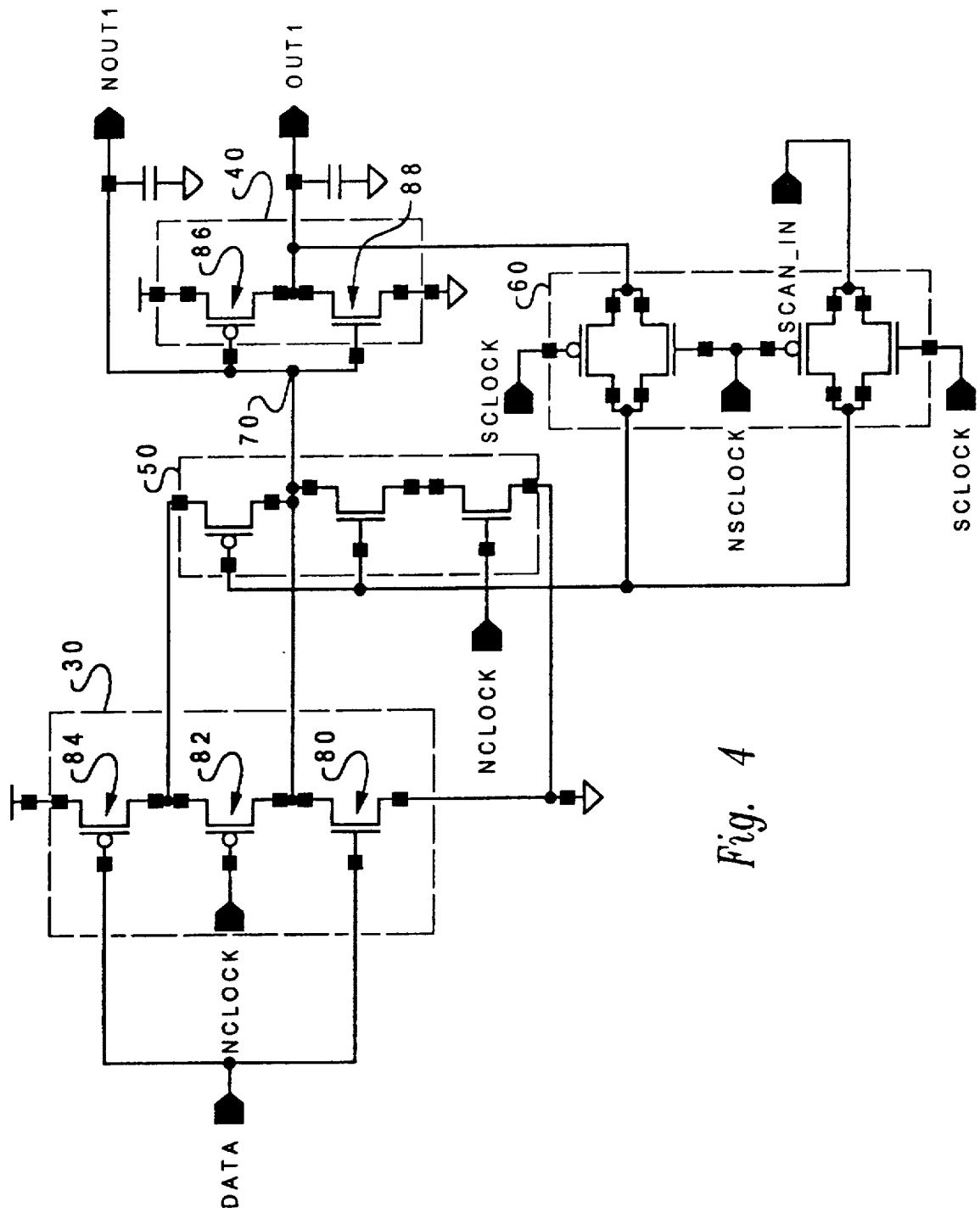
FIG. 4 depicts a high performance dynamic logic compatible latch in accordance with a preferred embodiment of the present invention.

Referring now to FIG. 4, there is depicted an alternative preferred embodiment of the present invention. This latch uses a P-stack dynamic structure which is analogous to the operation of the N-stack dynamic structure of the present invention disclosed in FIG. 2. Therefore, all of the above description is then applicable to FIG. 4 with the exception of reversed activation levels on the clock and on the data signal input. This high-performance latch is tuned to respond quickly to rising edges of a data pulse on the data signal input. During the latching phase, the data signal will be precharged to a low voltage, in this case ground. During this latching phase, the clock signal, NCLOCK, is held high. During the evaluate phase, the clock signal NCLOCK is switched low. In order to tune the latch for high-speed operation in rising edge dynamic logic, the ratio of size between NMOS transistor 80 and PMOS transistors 82, 84 is high—for example, transistor 80 may be sized four to eight times larger. In addition, PMOS transistor 86 may be sized four to eight times larger than NMOS transistor 88 to similarly tune the output CMOS invertor to quickly switch its output in response to a rising edge.

A more generic description of the operation of the high performance latch of the present invention follows. This description is applicable to both embodiments of the present invention disclosed in FIG. 2 and FIG. 4.

Input invertor 30 is controlled by the input data signal DATA and the clock signal CLOCK. The DATA signal controls a PMOS transistor and an NMOS transistor connected in series between a high and a low reference voltage. This configuration creates the well known and well understood CMOS invertor. The output node of the invertor is output node 70. Input invertor 30 also includes a third MOSFET transistor connected in series between the two transistors that make up the CMOS invertor. This transistor is controlled by the CLOCK signal input and acts as a transistor switch. As the clock toggles between its two states, this MOSFET transistor is turned on and off. This effectively controls current through the CMOS invertor, and thereby, disables or enables input invertor 30.

The output node 70 of input invertor 30 is connected to the input of invertor 40. Invertor 40 is a CMOS invertor comprised of a PMOS transistor in series with an NMOS transistor between two reference voltages. Both transistor gates are controlled by the output node of input invertor 30. The output node OUT of output invertor 40 is always the inverse of the high or low value present on the output node of input inverter 30. The output of output invertor 40 is input into transmission circuit 60. This circuit operates as a switch under the control of a scan control signal, in this case, SCLOCK and NSCLOCK. Transmission circuit 60 has two inputs: the output from output invertor 40 and a scan data input signal SCAN_IN. Depending on the scan control signals, transmission circuit 60 transmits one input or the other.

Although transmission circuit 60 has been included in the latch of the preferred embodiment of the present invention, its presence is only needed for the convenience and flexibility of clocking scan data into the latch. This feature is extremely useful in testing logic and control functions of integrated circuits which utilize this latch. It should be understood that the present invention could be practiced without the inclusion of transmission circuit 60 in the latch. In that case, the circuit would be designed by connecting the output of output invertor 40 with the input of feedback invertor 50.

The output signal from transmission circuit 60 is input into feedback invertor 50. Feedback invertor 50 is comprised of three MOSFET transistors connected in series between two reference voltages. Two transistors, a PMOS and a NMOS, are controlled by the output from transmission circuit 60. This creates a CMOS invertor having an output connected to output node 70. The third transistor in the three series-transistors that comprise feedback invertor 50 acts as a transistor switch and is controlled by the clock signal. As the clock toggles between its two states, this MOSFET clock signal. As the clock toggles between its two states, this MOSFET transistor is turned on and off. This effectively controls current through the CMOS invertor, and thereby, disables or enables feedback invertor 50.

The transistor switch in feedback invertor 50 and the transistor switch in input invertor 30 are both controlled by the same clock. However, the two transistors are complementary such that one is a PMOS and one is a NMOS transistor. Thus, when the clock is at a low level, the PMOS transistor is turned on and enables its invertor, while the NMOS transistor is turned off, disabling its invertor. When the clock signal goes to an active high level, the PMOS transistor is turned off and the NMOS transistor is turned on. In this way, input invertor 30 and feedback invertor 50 are alternately enabled and disabled by the same clock but in opposite phase to each other. In other words, at one clock level, input invertor 30 is enabled and feedback invertor 50 is disabled; during a second level of the clock, input invertor 30 is disabled and feedback invertor 50 is enabled.

The latch of the present invention operates as follows. When the clock is at one level, input invertor 30 is enabled and the data signal is inverted onto the output node, which is inverted again at the output invertor 40. At this clock level, feedback invertor 50 is disabled, and so it does not "fight" the input invertor 30 to set the output node value. Also during this clock level, the data signal is transparent through the latch.

When the clock signal switches states, the latch holds or "latches" the data signal value input to invertor 30 just prior to the clock level switching. At this second clock level, input invertor 30 is disabled and feedback invertor 50 is enabled. The output from output invertor 40 is input into feedback invertor 50. Because the output of feedback invertor 50 is input into output invertor 40, the output signal of the latch, OUT, and its complement, NOUT, are locked in their respective values for the duration of the current clock level.

Some advantages of the present invention are apparent from the above description. First, only a single rail data input signal and a single rail clock input signal are required for the circuit. The complements of these signals are not required. Therefore, the inherent delay in generating these complements is not introduced and the clock switching within the latch is inherently synchronized, thus, significantly reducing the effects of a slewed clock.

Figure 1:
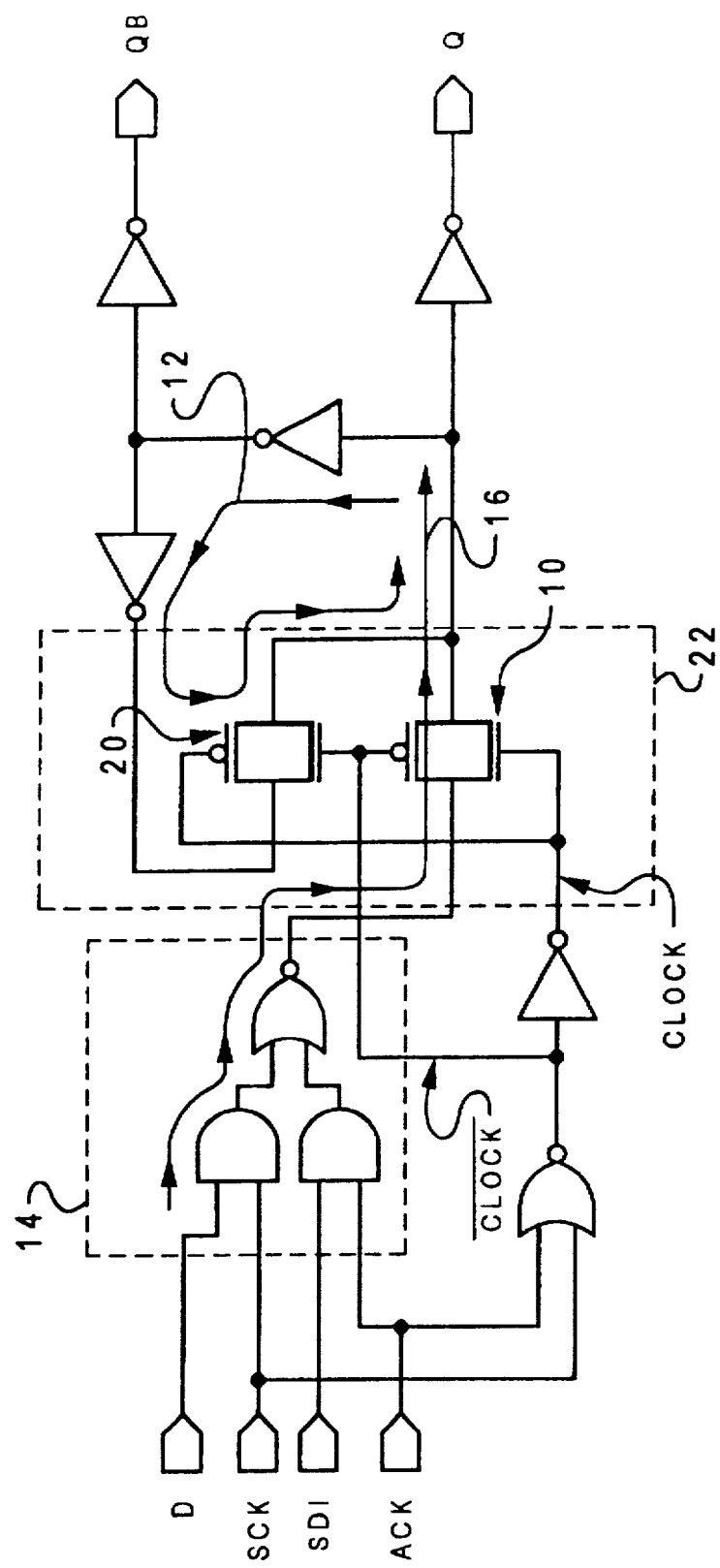
FIG. 1 depicts a prior art transparent latch.

A second advantage is that, while the latch is transparent, the signal delay through the latch is very short. The shortest data path through the latch is from the data input to NOUT. This data path is delayed by only one transistor. This is a significant improvement over the prior art, as for example in FIG. 1, where the shortest data path passes through two multiplexors and a buffer.

A third advantage is the elimination of output buffers. Output invertor 40 can be designed to be sufficiently large to drive any given output capacitance. Similarly, feedback invertor 50 can be designed with sufficient current driving capability to drive output signal NOUT under significant loads. Thus, output buffers on the two output rails are not required. This improvement results from the fact that feedback invertor 50 is disabled while the latch is transparent. Thus, unlike the prior art, if the latch's output is switched, feedback invertor 50 does not have to be fought and overcome to switch its output value.

A fourth advantage is that the latch of the present invention is dynamic logic compatible. In dynamic logic, data is generally represented by a pulse of which the leading edge is of particular interest. The timing of dynamic logic is such that there is a window in time called the evaluate phase during which the input signal can make one transition from its standby state, often called the inactive state, to an active state. Dynamic logic circuitry can be designed to react to a falling edge or a rising edge. In the preferred embodiment of the high-performance dynamic logic compatible transparent latch of the present invention shown in FIG. 2, the latch has been designed to operate in a falling edge dynamic logic environment. The high-performance dynamic logic compatible transparent latch of an alternative preferred embodiment of the present invention shown in FIG. 4 has been designed to operate in a rising edge dynamic logic environment.

In summary, these new latches are not only faster than the traditional transparent latches but are particularly suited for dynamic logic applications where performance is critical. These latches can be built into common dynamic (domino) structures (for example, multiplexors), wherein both the latches and the structures operate with the same clock input. Such an application would minimize set up, hold and skew problems commonly seen in the prior art. This performance enhancement leaves more time during the clocking cycle in which real "work" by the combinatorial logic can be done with less time wasted away meeting set up, hold and skew requirements. The wide range of tuning that can be done on the transistor sizes and ratios for performance enhancement, AC and DC noise margin improvement, and charge coupling resistance lets the circuit designer easily optimize a latch for his unique circuit.

While the invention has been particularly shown and described with reference to a preferred embodiment, it will be understood by those skilled in the art that various changes in form and detail may be made therein without departing from the spirit and scope of the invention.

We claim:

1. A high performance dynamic logic compatible transparent latch controlled by a single clock, said transparent latch comprising:

a data input and a data output;

a first invertor having a first invertor input, a single clock input, and a first invertor output, wherein said first invertor input is directly connected to said data input, said first invertor being enabled only by a first phase of an input clock and being disabled only by a second phase of the input clock, the first invertor consisting of only a first pair of complementary transistors and a first switch connected in series, wherein said data input is connected to the first pair and the input clock controls the first switch;

a second invertor having a second invertor input and a second invertor output, the second invertor input being directly connected to the first invertor output and the second invertor output being directly connected to said data output; and a third invertor having a third invertor input, a third invertor output, and a single clock input, the third invertor being enabled only by the second phase of the input clock and disabled only by the first phase of the input clock, wherein said third invertor input is coupled to the data output and said third invertor output is connected to the second invertor input, the third invertor consisting of only a second pair of complementary transistors and a second switch connected in series, wherein said data output is coupled to the second pair, the input clock controls the second switch, and a transistor within the second pair of complementary transistors is connected in parallel with the first switch.

2. A high performance transparent latch according to claim 1, wherein a data signal on the data input comprises a pulse having a first edge and a second edge, and further wherein the transparent latch is configured to switch states on the data output in response to the first edge on the data input.

3. A high performance transparent latch according to claim 2, further wherein the first inverter is tuned for high speed response to the first edge and low speed response to the second edge.

4. A high performance transparent latch according to claim 3, wherein the first edge is a falling edge and the second edge is a rising edge.

5. A high performance transparent latch according to claim 1, wherein each invertor comprises a CMOS invertor.

6. A high performance transparent latch according to claim 1, wherein the first invertor consists of less than four transistors.

7. A high performance transparent latch according to claim 6, wherein the third invertor consists of at most three transistors connected in series with one of said first pair of complementary transistors of the first invertor.

8. A high performance dynamic logic compatible transparent latch controlled by a single clock, comprising:

a data input and a data output;

a first transistor connected to a first reference voltage and being connected to said data input;

a second transistor connected in series with the first transistor and being driven by a single clock signal, the common node between the first and second transistors being an internal node;

a third transistor connected in series with the second transistor between the second transistor and a second reference voltage, and connected to the data input, wherein the series connection of the first transistor with the second transistor and the series connection of the second transistor with the third transistor forms a first series circuit containing only the first, second, and third transistors connected between the first reference voltage and the second reference voltage;

a fourth transistor connected in parallel with the second transistor;

a first pair of series-connected transistors connected between said first reference voltage and the internal node, a first transistor of the first pair being complementary to the second transistor and being driven only by the single clock signal, wherein the third transistor, fourth transistor, and the first pair of series-connected transistors forms a second series circuit connected between the first and second reference voltages containing only the third transistor, fourth transistor and the first pair of series-connected transistors; and a second pair of series-connected transistors connected between said first reference voltage and said second reference voltage, the second pair being driven by the internal node, said second pair further having a common node connected to said data output and coupled to inputs of the fourth transistor and a second transistor within the first pair of series-connected transistors.

9. A high performance transparent latch according to claim 8, wherein the first transistor is a PMOS and the first reference voltage connected to said first transistor is an upper voltage rail, the second transistor is a NMOS, the third transistor is a NMOS and the second reference voltage connected to said third transistor is a lower reference rail, the fourth transistor is a NMOS, the first pair is PMOS and is connected to the upper voltage rail, and the second pair is CMOS connected between the upper and lower voltage rails.

10. A high performance transparent latch according to claim 8, wherein an input data signal at said data input comprises a pulse having a first edge and a second edge, and further wherein the transparent latch is configured to switch states at the data output in response to the first edge.

11. A high performance transparent latch according to claim 10, wherein the first edge is a falling edge and the second edge is a rising edge.

12. A high performance transparent latch according to claim 8, wherein the coupling between the common node of the second pair and the inputs of the fourth transistor and the second transistor of the first pair of series-connected transistors comprises a first NMOS and a first PMOS transistor connected in parallel and driven by complementary clocks, and further wherein a second PMOS and a second NMOS transistor are connected in parallel to the inputs of the fourth transistor and the second transistor of the first pair of series-connected transistors, and wherein the second PMOS is driven by the clock driving the first NMOS and the second NMOS is driven by the clock driving the first PMOS.

* * * * *